United States Patent [19]

Kim

[11] Patent Number: 5,034,333
[45] Date of Patent: Jul. 23, 1991

[54] METHOD OF MANUFACTURING AN AMORPHOUS SILICON SOLAR CELL

[75] Inventor: Kangwon Kim, Chungja-dong, Rep. of Korea

[73] Assignee: Samsung Electron Devices Co., Ltd., Rep. of Korea

[21] Appl. No.: 427,192

[22] Filed: Oct. 26, 1989

[30] Foreign Application Priority Data

Oct. 27, 1988 [KR] Rep. of Korea .................... 88-14032

[51] Int. Cl.⁵ ............................................. H01L 31/18
[52] U.S. Cl. ......................................... 437/4; 136/258; 357/30
[58] Field of Search .................... 437/4; 136/258 AM; 357/30 J, 30 K

[56] References Cited

FOREIGN PATENT DOCUMENTS

| 58-15231 | 1/1983 | Japan | 136/258 AM |
| 59-107574 | 6/1984 | Japan | 136/258 AM |
| 60-192374 | 9/1985 | Japan | 136/258 AM |
| 61-160979 | 7/1986 | Japan | 136/258 AM |
| 62-188381 | 8/1987 | Japan | 136/258 AM |

*Primary Examiner*—Aaron Weisstuch
*Attorney, Agent, or Firm*—Christie, Parker & Hale

[57] ABSTRACT

A method of manufacturing an amorphous silicon solar cell is disclosed in which the intrinsic body is formed as three laminated layers which are deposited by controlling the level of RF power for each lamina, thereby enhancing efficiency converting sunlight into electricity and promoting productivity.

9 Claims, 1 Drawing Sheet

METHOD OF MANUFACTURING AN AMORPHOUS SILICON SOLAR CELL

FIELD OF THE INVENTION

The present invention relates to a method of manufacturing an amorphous silicon solar cell and more particularly to a method of manufacturing a solar cell with a p-i-n structure having a relatively thick intrinsic body in which laminated layers may be produced by depositing at a high speed and controlling the power generated from a regulated RF, AC or DC source for efficiently converting sunlight into electricity.

BACKGROUND OF THE INVENTION

Generally, an amorphous silicon solar cell may be produced by a relatively simple process in comparison with a single crystal solar cell and it has been recognized that energy savings can be achieved by manufacturing at a low level of temperature, and with a thin film.

In promoting productivity, however, in an amorphous silicon solar cell it is always required that layers of the solar cell should be produced at a relatively high speed. Recently, considerable effort has been made to develop a process for rapidly growing layers of the solar cell by using a gas of silane such as $Si_2H_6$ in order to promote productivity of the solar cell.

However, in the case where a solar cell is produced by a gas of monosilane which is relatively low in cost in comparison with a gas of $Si_2H_6$ as mentioned above, it is required that the layers of the solar cell should be grown by means of controlling the level of the applied RF power generated due to the layers being grown slowly in the process therefor.

The RF power is utilized for a plasma discharging deposition in the process of growing the layers. Nevertheless, where a prior art amorphous silicon solar cell is provided with an intrinsic body, which is formed of relatively thick layers by using monosilane and the RF power is increased, as explained above, it has been found that efficiency of a solar cell converting sunlight into electricity has been reduced rapidly in connection with the RF power as illustrated in FIG. 2, and a problem has also been found in that the conversion efficiency as stated above has been reduced rapidly as shown in FIG. 3, even though the layers of the solar cell are grown quickly.

SUMMARY OF THE INVENTION

In order to prevent this problem and to make an improved cell, an object of the present invention is to provide a method of manufacturing an amorphous silicon solar cell in which the intrinsic body thereof is produced by means of controlling the RF power during the process so as to enhance efficient conversion of sunlight into electricity.

A further object of the present invention is to provide a method of manufacturing an amorphous silicon solar cell in which the intrinsic body thereof is formed from layers grown rapidly to promote productivity of the cells.

To achieve the above objectives in accordance with a preferred embodiment of the present invention, the solar cell comprises an intrinsic body which is produced by the process of controlling the level of the RF power to enhance the conversion efficiency and to promote the growing speed of the layers.

Briefly, a method of manufacturing an intrinsic body of a solar cell according to the present invention involves producing a first layer of the intrinsic body upon a P-type a-Si layer by using a low level of RF power, depositing a second layer of the body upon the first layer by using a high level of RF power, and forming a third layer of the body upon the second layer by using a low level of RF power.

BRIEF DESCRIPTION OF THE DRAWINGS

The above objectives and other advantages of the present invention will become more apparent by describing in detail a preferred embodiment of the present invention with reference to the attached drawings in which.

DESCRIPTION OF THE PREFERRED EMBODIMENT

Figure 1:
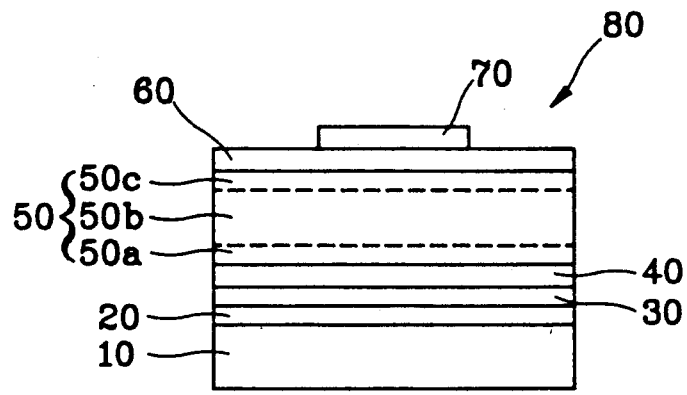
FIG. 1 is a sectional view of an amorphous silicon solar cell manufactured in accordance with an embodiment of the present invention.

Referring now to FIG. 1, there is illustrated a sectional view of an amorphous silicon solar cell manufactured in accordance with an embodiment of the present invention.

The lower portion of the solar cell 80 has a structured configuration provided with a substrate 10, an electrode layer 20, a $SnO_2$ layer 30 and a P-type a-Si layer 40 which are laminated by a conventional process, in this order.

The solar cell 80 includes a substrate 10 which may be glass or a flexible web formed from stainless steel or aluminum. For example, the electrode layer 20 of ITO (indium thin oxide) is deposited in one or more layers upon the substrate 10 to form a base electrode for the cell 80. The $SnO_2$ layer 30 is deposited on the electrode layer 20 by sputtering, and thereafter P-type a-Si layer 40 deposited on the $SnO_2$ layer 30 is formed to about 100 angstroms in the thickness.

An intrinsic amorphous semiconductor body 50, approximately 5000 angstroms in thickness includes a first layer 50a of about 300 angstroms in thickness which is formed adjacent the a-Si layer 40 by using low RF power, a second layer 50b of about 4000 angstroms in thickness is deposited upon the first layer 50a by using high RF power, and a third layer 50c of about 700 angstroms in thickness is produced upon said second layer 50b by using low RF power to enhance the contact characteristics with an N-type semiconductive layer 60.

Further, the upper portion of the solar cell 80 with the intrinsic body 50 manufactured by the above-mentioned manner includes the N-type conductive layer 60 of about 500 Å thickness, and a metal electrode 70 of approximately 1000 Å thickness coated on layer 60. A metal electrode 70 is formed on the N-type conductive layer 60 by coating it with melted aluminum.

The method of manufacturing an amorphous silicon solar cell 80 having the above-mentioned structure in accordance with the present invention will now be discussed.

The substrate 10 of the solar cell 80 is placed in the temperature range of 200° to 300° C. in the pressure range of 0.3 to 0.9 Torr, and in the power range of 20 to 40 watts RF where the power is generated from a regulated RF, AC or DC source (not shown).

Under the glow discharge deposition environment mentioned above, the lower electrode layer 20 and the $SnO_2$ layer 30 are deposited on the substrate 10, in order.

The P-type a-Si layer 40 is formed on the $SnO_2$ layer 30 while the substrate 10 is maintained at approximately 250° C. and under about 0.6 Torr pressure, while being subjected to monosilane gas flowing at a rate in the order of about 10 s.c.c. per minute, $H_2$ gas flowing at a rate in the order of about 40 s.c.c. per minute, about 1% $B_2H_6$ relative to $SiH_4$, and 35 watts of RF power.

It has been found that the transparent characteristics are enhanced by using 200% $CH_4$ relative to $Si_2H_6$ and under a $H_2$ gas flow rate on the order of about 20 s.c.c. per minute. Further, while the intrinsic body 50 is being deposited on the a-Si layer 40, the substrate 10 under 0.8 Torr pressure is placed at about 250° C. while being subjected to a monosilane gas flow rate on the order of about 80 s.c.c. per minute, $H_2$ gas flow rate on the order of about 20 s.c.c. per minute and 10 watts of RF power. Thus, it has been found that first layer 50a of about 300 Å thickness is deposited on the a-Si layer 40 by means of the above-described discharge deposition environment.

Under the environment explained above, the second layer 50b of about 4000 angstroms thickness is formed on the first layer 50a, while increasing the RF power from only 10 watts to 60 watts of RF power.

In addition, the third layer 50c of about 700 Å thickness is deposited upon the second layer 50b, while decreasing the RF power to only 10 watts of low RF power from 60 watts.

The N-type conductive layer 60 deposited on the third layer 50c of intrinsic body 50 is formed from an N-type a-Si layer, and is manufactured while the substrate 10 is under about 0.8 Torr pressure at about 250° C., while subjected to monosilane gas flow rate on the order of about 8 s.c.c. per minute, $H_2$ gas flow rate on the order of about 2 s.c.c. per minute, 0.1% $PH_3$ relative to $SiH_4$ and under 20 watts of RF power. As a result the layer 60 is formed by the glow discharge deposition which is according to the above-noted environment.

The solar cell 80 is completed with the metal electrode 70 of about 1000 Å thickness deposited on the N-type conductive layer 60 by a sputtering method.

Figure 2:
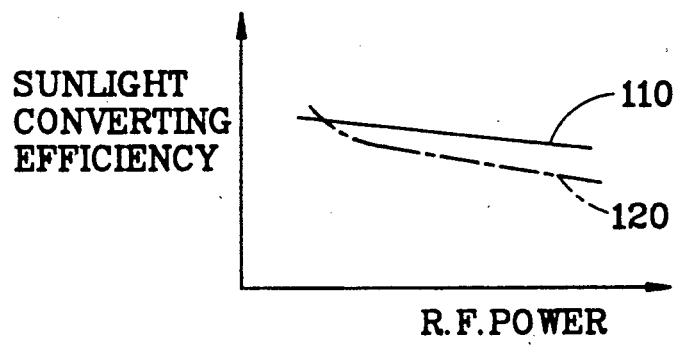
FIG. 2 is a graph illustrating the efficiency of converting sunlight into electricity as a function of RF power in the manufacture of a solar cell using the present invention in comparison with that of the prior art.

According to the present invention, it has been found that the solar cell is capable of maintaining constant conversion efficiency as a function of RF power in comparison with the prior art solar cell, as illustrated in FIG. 2. Referring to FIG. 2, the converting efficiency of the cell, which is manufactured in accordance with the present invention, is represented by reference number 110; the conversion efficiency of the prior art solar cell is represented by 120.

Figure 3:
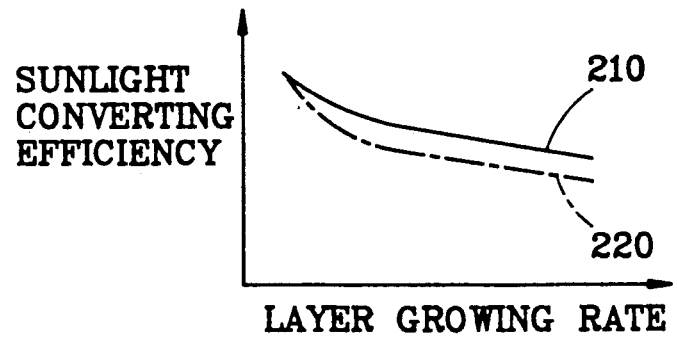
FIG. 3 shows a graph illustrating the efficiency of converting sunlight into electricity for layer growing ratio in the manufacture of a solar cell using the present invention in comparison with that of the prior art.

In addition, it has also been found that the conversion efficiency of the solar cell has not been reduced as much as a function of the growing rate of the layers, as shown in FIG. 3. In FIG. 3, reference number 210 and 220 represent conversion efficiencies of the solar cell, which is provided in accordance with the invention, and the prior art solar cell, respectively.

Accordingly, the above manner of manufacturing the solar cell has provided an intrinsic body with a first layer 50a deposited as a low RF power layer on the P-type a-Si layer 40 formed as a P+ region to reduce shock due to high RF power applied to the layer 40, the third layer 50c is formed as a low RF layer under the N-conductive layer 60 to enhance adhesive characteristics with the layer 60, and the second layer 50b is produced with a high RF power layer sandwiched between the first layer 50a and the third layer 50c, which allows formation of the intrinsic body 50 as quickly as possible, and without several problems noted above.

According to the present invention, a method of manufacturing an amorphous silicon solar cell is provided in which an intrinsic body is produced rapidly, thereby being capable of enhancing productivity of a solar cell and thereby promoting the efficient conversion of sunlight into electricity.

What is claimed is:

1. A method of manufacturing an amorphous silicon solar cell comprising a glass substrate, an ITO electrode coated on the substrate, a $SnO_2$ layer deposited on the electrode, a P-type a-Si layer formed on the $SnO_2$ layer, an intrinsic amorphous silicon body deposited on the a-Si layer, an N-type on the intrinsic body, and a metal electrode, on the N-type layer, the method comprising the steps of:

(a) depositing a first layer of the intrinsic body upon the P-type a-Si layer by using a relatively low level of RF power;

(b) depositing a second layer of the intrinsic body on the first layer by using a relatively high level of RF power; and (c) depositing a third layer of the intrinsic body on the second layer by using a relatively low level of RF power.

2. A method as defined in claim 1 wherein the intrinsic body is deposited with a thickness larger than the thickness of the N-type a-Si layer.

3. A method as defined in claim 1 wherein the second layer of the intrinsic body is deposited with a larger thickness than the first or the second layer.

4. A method as defined in claim 1 wherein the intrinsic body is deposited with the first layer being of about 300 Å thickness, the second layer being of about 4000 Å thickness and the third layer being of about 700 Å thickness.

5. A method as defined in claim 1 wherein the substrate is maintained in the temperature range of about 200° to 300° C., in the pressure range of about 0.3 to 0.9 Torr and under about 20 to 40 watts RF power, for depositing the ITO electrode and the $SnO_2$ layer, in order.

6. A method as defined in claim 1 wherein the substrate is maintained in the temperature range of about 200° to 300° C., in the pressure range of about 0.3 to 0.9 Torr, in monosilane and $H_2$ gas flow rates on the order of about 10 and 40 s.c.c. per minute, respectively, and under 35 watts RF power, with in addition, 1% $B_2H_6$ relative to the monosilane, while depositing the P-type a-Si layer on the $SnO_2$ layer.

7. A method as defined in claim 1 wherein the P-type a-Si layer is deposited on the $SnO_2$ layer while subjected to 200% $CH_4$ gas relative to $Si_2H_6$ gas.

8. A method as defined in claim 1 wherein the substrate is maintained at a temperature of about 250° C.

while subjected to about 0.8 Torr pressure and flows of monosilane and H$_2$ gas on the order of about 80 and about 20 s.c.c. per minute, respectively, depositing the first layer of the intrinsic body on the P-type a-Si layer while using about 10 watts RF power, depositing the second layer on the first layer while using about 60 watts RF power and depositing the third layer on the second layer using about 10 watts RF power.

9. A method as defined in claim 1 wherein the substrate is maintained at a temperature of about 250° C. under about 0.8 Torr pressure, while subjected to flows of monosilane and H$_2$ gas on the order of about 8 and 2 s.c.c. per minute, respectively, and in addition, 0.1% PH$_3$ gas relative to the monosilane, thereby depositing the N-type conductive layer on the third layer of the intrinsic body.

* * * * *

UNITED STATES PATENT AND TRADEMARK OFFICE
CERTIFICATE OF CORRECTION

PATENT NO.  :   5,034,333
DATED       :   July 23, 1991
INVENTOR(S) :   Kangwon Kim It is certified that error appears in the above-identified patent and that said Letters Patent is hereby corrected as shown below:

On the cover Page:

[75] Inventor, change "Chungja-dong" to -- Suwon-City --.

Column 3, line 52, insert "Accordingly" before "The" and change "The" to -- the --.

Column 3, line 52, after "80" change "is" to -- has been --.

Column 3, line 67, change "number" to -- numbers --.

Column 4, line 27, after "N-type" insert -- layer --.

Signed and Sealed this

Second Day of March, 1993

Attest:

STEPHEN G. KUNIN

Attesting Officer

Acting Commissioner of Patents and Trademarks